(12) United States Patent
Huang et al.

(10) Patent No.: US 9,306,577 B2
(45) Date of Patent: Apr. 5, 2016

(54) SUPPLY VOLTAGE DRIFT INSENSITIVE DIGITALLY CONTROLLED OSCILLATOR AND PHASE LOCKED LOOP CIRCUIT

(71) Applicant: MediaTek Inc., Hsin-Chu (TW)

(72) Inventors: Yi-Chieh Huang, Taichung (TW); Ping-Ying Wang, Hsinchu (TW)

(73) Assignee: MEDIATEK INC., Hsin-Chu (TW)

( * ) Notice: Subject to any disclaimer, the term of this patent is extended or adjusted under 35 U.S.C. 154(b) by 75 days.

(21) Appl. No.: 13/778,935

(22) Filed: Feb. 27, 2013

(65) Prior Publication Data

US 2014/0240053 A1    Aug. 28, 2014

(51) Int. Cl.
*H03K 3/03* (2006.01)
*H03L 1/00* (2006.01)
*H03L 7/099* (2006.01)
*H03L 7/14* (2006.01)

(52) U.S. Cl.
CPC .............. *H03L 1/00* (2013.01); *H03L 7/0995* (2013.01); *H03K 3/0315* (2013.01); *H03L 7/14* (2013.01); *H03L 2207/06* (2013.01); *H03L 2207/08* (2013.01)

(58) Field of Classification Search
CPC ...... H03K 3/0315; H03L 7/0995; H03L 1/00; H03L 7/14; H03L 2207/08; H03L 2207/06
USPC ........ 327/150, 159; 331/1 A, 1 R, 16, 25, 34, 331/45, 57, 175, 184, 185; 375/376
See application file for complete search history.

(56) References Cited

U.S. PATENT DOCUMENTS

| | | | |
|---|---|---|---|
| 4,337,529 A * | 6/1982 | Morokawa | 377/20 |
| 5,317,287 A | 5/1994 | Brown | |
| 5,682,123 A | 10/1997 | Chau | |
| 5,898,343 A | 4/1999 | Morgan | |
| 6,825,735 B2 | 11/2004 | Chung | |
| 7,455,450 B2 | 11/2008 | Liu et al. | |
| 7,633,351 B2 | 12/2009 | Raita et al. | |
| 7,701,301 B2 | 4/2010 | Lakshmikumar et al. | |
| 7,777,580 B2 * | 8/2010 | Dosho et al. | 331/57 |
| 8,154,352 B2 * | 4/2012 | Ueno | 331/57 |
| 8,217,725 B2 * | 7/2012 | Kondou | 331/57 |
| 8,258,880 B2 * | 9/2012 | Koh et al. | 331/34 |
| 8,390,349 B1 * | 3/2013 | Ravi et al. | 327/156 |

(Continued)

FOREIGN PATENT DOCUMENTS

| | | |
|---|---|---|
| CN | 101132167 A | 2/2008 |
| JP | 05-299982 | 11/1993 |

OTHER PUBLICATIONS

English language translation of abstract of JP 05-299982 (published Nov. 12, 1993).

*Primary Examiner* — Arnold Kinkead
*Assistant Examiner* — Richard Tan
(74) *Attorney, Agent, or Firm* — McClure, Qualey & Rodack, LLP

(57) ABSTRACT

A digitally controlled oscillator includes a ring oscillator and a first supplementary circuit. The ring oscillator is coupled to a supply voltage and generates a signal oscillated at an oscillating frequency. The oscillating frequency is controlled by a digital code and further varies with a supply voltage drift in a first direction. The first supplementary circuit is coupled to the ring oscillator and facilitates the oscillating frequency to vary with the supply voltage drift in a second direction reverse to the first direction.

7 Claims, 8 Drawing Sheets

(56) References Cited

U.S. PATENT DOCUMENTS

| | | |
|---|---|---|
| 8,624,681 B2 | 1/2014 | Guo et al. |
| 2004/0036545 A1 | 2/2004 | Chung |
| 2005/0156678 A1 | 7/2005 | Lu |
| 2007/0081575 A1 | 4/2007 | Liu et al. |
| 2012/0049964 A1 | 3/2012 | Guo et al. |
| 2012/0223778 A1* | 9/2012 | Shin et al. ............ 331/34 |
| 2013/0120047 A1* | 5/2013 | Dally ............ 327/276 |
| 2014/0022023 A1* | 1/2014 | Huang ............ 331/57 |

* cited by examiner

SUPPLY VOLTAGE DRIFT INSENSITIVE DIGITALLY CONTROLLED OSCILLATOR AND PHASE LOCKED LOOP CIRCUIT

BACKGROUND OF THE INVENTION

1. Field of the Invention

The invention relates to an oscillator, and more particularly, to an oscillator that is stable and insensitive to supply-voltage drift.

2. Description of the Related Art

An oscillator is used in electronic circuits to generate precise clock signals. However, the oscillation frequency of an oscillator is generally unstable. In particular, the oscillation frequency varies with ambient temperature and supply-voltage drift, which affects the operation of the device.

Thus, it is desirable to design a novel oscillator that is stable and insensitive to supply-voltage drift.

BRIEF SUMMARY OF THE INVENTION

Digitally controlled oscillators and phase locked loop circuits are provided. An exemplary embodiment of a digitally controlled oscillator comprises a ring oscillator and a first supplementary circuit. The ring oscillator is coupled to a supply voltage and generates a signal oscillated at an oscillating frequency. The oscillating frequency is controlled by a digital code and further varies with a supply voltage drift in a first direction. The first supplementary circuit is coupled to the ring oscillator and facilitates the oscillating frequency to vary with the supply voltage drift in a second direction reverse to the first direction.

An exemplary embodiment of a phase locked loop circuit comprises a phase frequency detector, a digital loop filter, a digitally controlled oscillator and a divider. The phase frequency detector detects a phase difference between a feedback signal and a reference signal, and generates a phase error signal in response to the detected phase difference. The digital loop filter outputs a digital code based on the phase error signal. The digitally controlled oscillator is coupled to a supply voltage, receives the digital code and generates a signal oscillated at an oscillating frequency in response to the digital code. The divider receives the signal generated by the digitally controlled oscillator to generate the feedback signal. The digitally controlled oscillator comprises a ring oscillator and a first supplementary circuit coupled to the ring oscillator for facilitating the oscillating frequency to decrease as the supply voltage increases.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
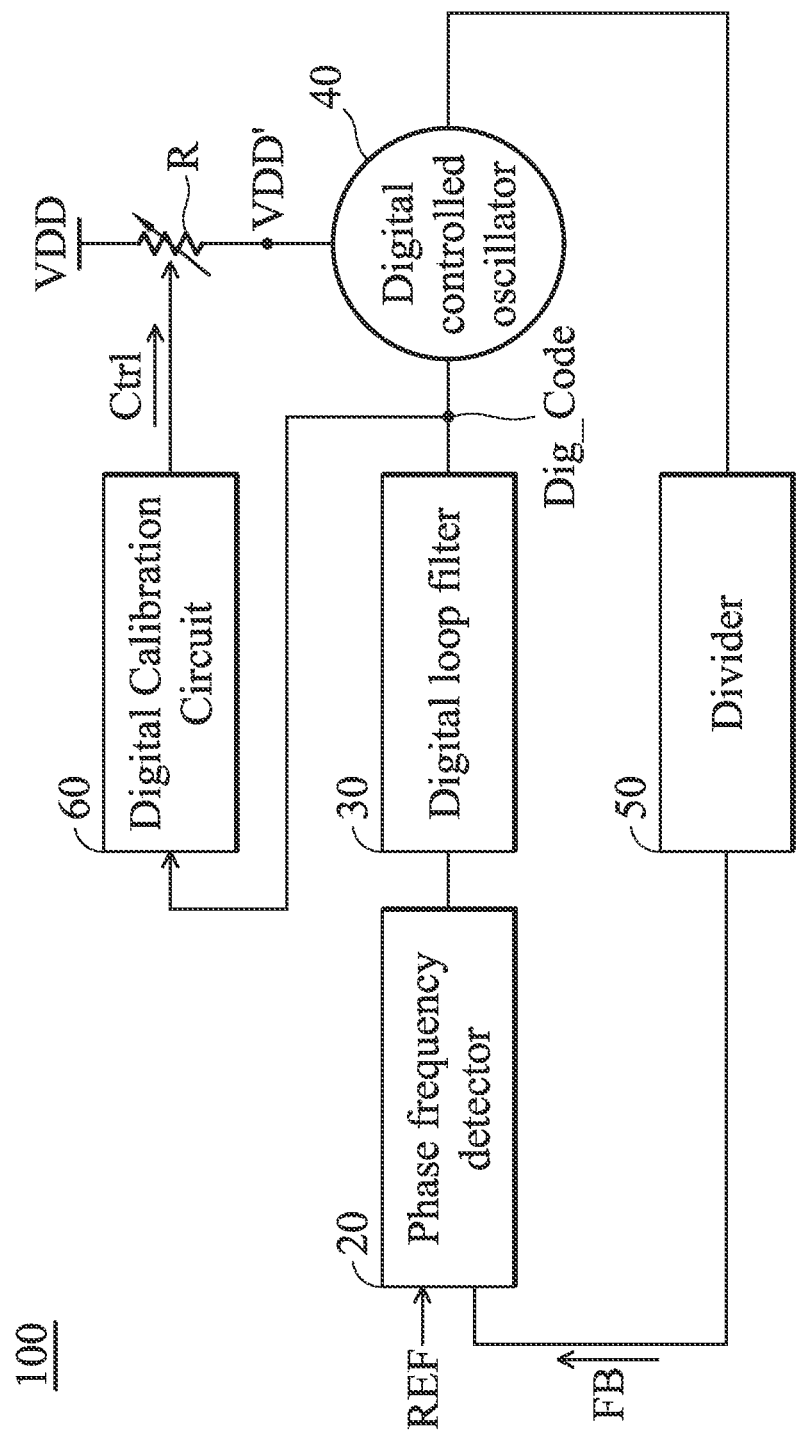
FIG. 1 shows a block diagram of a phase locked loop circuit according to an embodiment of the invention.

FIG. 1 shows a block diagram of a phase locked loop circuit according to an embodiment of the invention. According to an embodiment of the invention, the phase locked loop circuit 100 may be an all digital phase locked loop. The phase locked loop circuit 100 may basically comprise a phase frequency detector 20, a digital loop filter 30, a digitally controlled oscillator 40 and a divider 50. The phase frequency detector 20 detects a phase difference between a feedback signal FB and a reference signal REF, and generates a phase error signal in response to the detected phase difference. The digital loop filter 30 outputs a digital code Dig_Code based on the phase error signal. For example, the digital loop filter 30 may accumulate the phase error signal, which may be a binary value for representing a phase lead or phase lag condition, and output the accumulation result as the digital code Dig_Code. The digitally controlled oscillator 40 is coupled to a supply voltage VDD, receives the digital code Dig_Code and generates a signal oscillated at an oscillating frequency in response to the digital code Dig_Code. The oscillating frequency is substantially controlled by the digital code Dig_Code. The divider 50 receives the signal generated by the digitally controlled oscillator 40 and frequency divides the signal to generate the feedback signal FB.

According to an embodiment of the invention, as compared with conventional oscillators, which are sensitive to ambient temperature and supply-voltage drift, the proposed digitally controlled oscillator has an improved power supply rejection ratio (PSRR) and is stable and insensitive to ambient temperature and supply-voltage drift.

Figure 2:
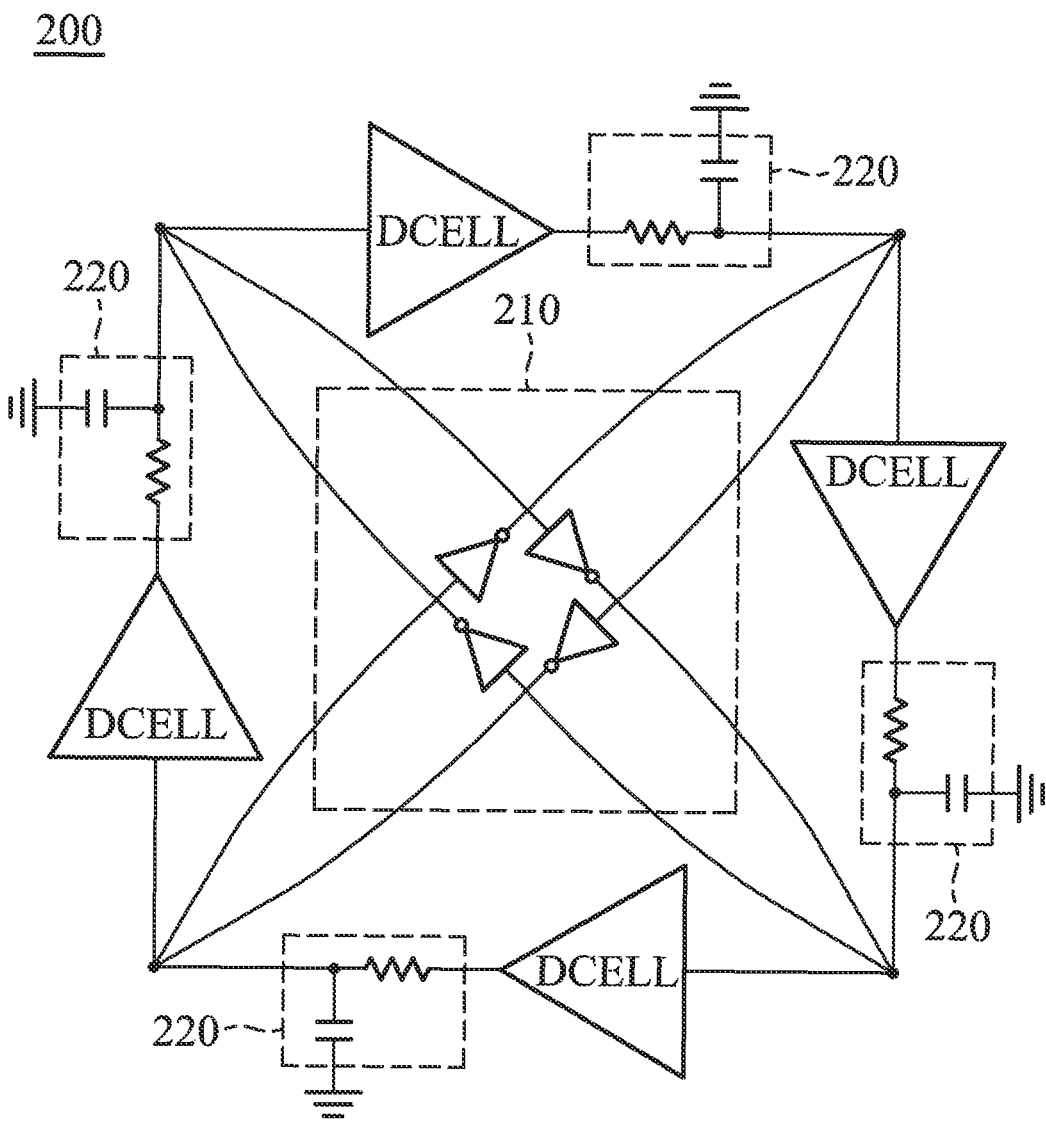
FIG. 2 shows an exemplary circuit diagram of a digitally controlled oscillator according to an embodiment of the invention.

FIG. 2 shows an exemplary circuit diagram of a digitally controlled oscillator according to an embodiment of the invention. The digitally controlled oscillator 200 may comprise a ring oscillator having a plurality of stages of delay cells DCELL coupled in a cyclic manner and at least a first supplementary circuit 210 coupled to the ring oscillator. The ring oscillator may have a positive voltage coefficient, causing the oscillating frequency to vary with the supply voltage drift in a first direction. To be more specific, when the voltage coefficient is positive, the oscillating frequency increases when the supply voltage increases.

Figure 3:
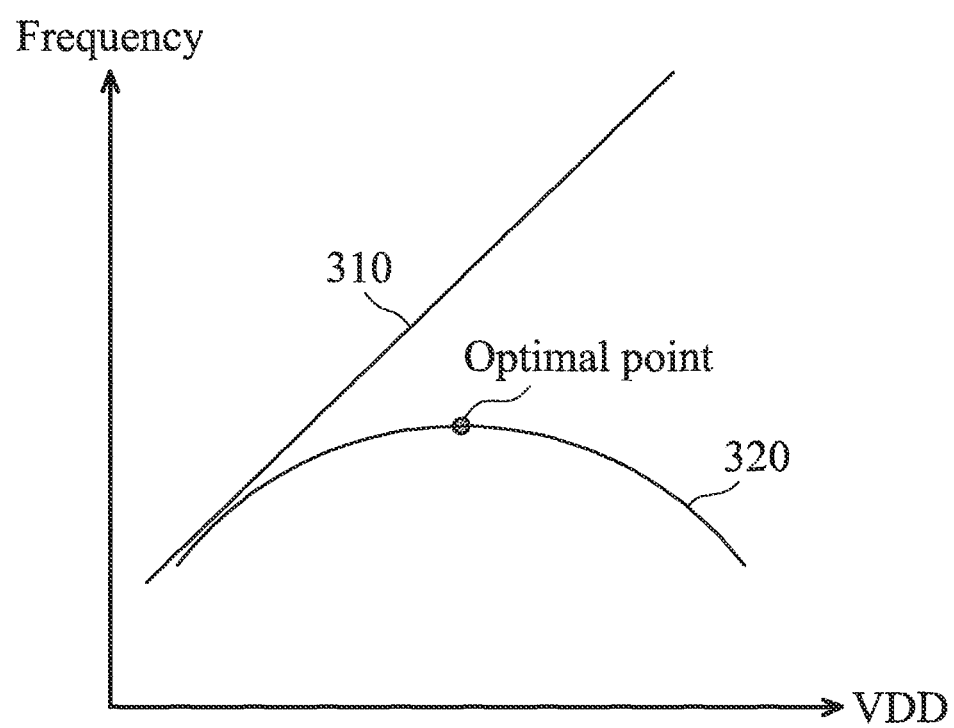
FIG. 3 shows characteristic curves of different voltage coefficients according to an embodiment of the invention.

FIG. 3 shows characteristic curves of different voltage coefficients according to an embodiment of the invention.

The X axis represents the supply voltage VDD and the Y axis represents the oscillating frequency of the signal generated by the digitally controlled oscillator. The curve 310 shows the relationship of oscillating frequency drift versus supply voltage drift when the digitally controlled oscillator comprises only a ring oscillator (that is, no proposed supplementary circuit is coupled thereto). As shown by the curve 310, because the ring oscillator has a positive voltage coefficient, the oscillating frequency of the signal generated by the ring oscillator increases when the supply voltage increases. Therefore, the oscillating frequency is unstable, which is undesired when a precise clock signal is required.

To solve this problem, according to an embodiment of the invention, referring back to FIG. 2, the digitally controlled oscillator 200 may comprise at least a first supplementary circuit 210 coupled to the ring oscillator. The first supplementary circuit 210 may be composed of one or more latches for providing a negative voltage coefficient capable of canceling the positive voltage coefficient of the ring oscillator, and facilitating the oscillating frequency to vary with the supply voltage drift in a second direction reverse to the first direction, such that oscillating frequency is finally become insensitive to the supply voltage drift. To be more specific, when the voltage coefficient is negative, the oscillating frequency decreases when the supply voltage increases.

In addition, to further improve the PSRR and stability, the digitally controlled oscillator 200 may further comprise one or more second supplementary circuit 220 comprising at least one resistor and at least one capacitor coupled in serial to an output node of at least one delay cell DCELL for further reducing the positive voltage coefficient contributed by the ring oscillator. The second supplementary circuit 220 contributes impedance at, at least one output node of the ring oscillator. In this manner, a speed for the oscillating frequency to increase with the supply voltage drift increases is slowed down or reduced.

Referring to FIG. 3, the curve 320 shows the resulting relationship of oscillating frequency drift versus supply voltage drift when the first and second supplementary circuits are coupled to the ring oscillator as shown in FIG. 2. Since the second supplementary circuit 220 may help to reduce the positive voltage coefficient contributed by the ring oscillator, the slope of the curve 310 is reduced and results in curve 320; which is noticeable at the section on the left of the optimal point, where the slop=0, of the curve 320. In addition, since first supplementary circuit 210 may provide a negative voltage coefficient to cancel the positive voltage coefficient contributed by the ring oscillator, the trend of the curve 320 is reversed; which is noticeable at the optimal point as compared with the curve 310. In other words, the oscillating frequency decreases when the supply voltage increases.

According to an embodiment of the invention, the curvature of the curve 320 may be adjusted by changing the latch size of the first supplementary circuit and/or the impedance contributed by the second supplementary circuit. Note that FIG. 2 shows only an exemplary two-staged digitally controlled oscillator, and the invention should not be limited thereto. Those who are skilled in this technology can still make various alterations and modifications without departing from the scope and spirit of this invention. For example, the digitally controlled oscillator may have more than two stages, or the first supplementary circuit 210 may comprise more or less than two latches, or the second supplementary circuit 220 may comprise more or less than four serially coupled resistors and capacitors. Note further that although the second supplementary circuit 220 shown in FIG. 2 is coupled to the ground, the invention should not be limited thereto. For example, the ground in FIG. 2 may be replaced by a common node coupled to the digital loop filter 30 for receiving the digital code Dig_Code therefrom.

Figure 4:
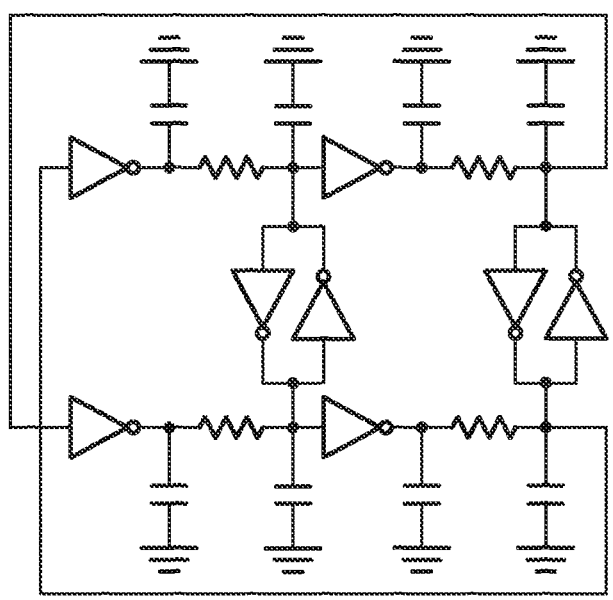
FIG. 4 shows another exemplary circuit diagram of a digitally controlled oscillator according to another embodiment of the invention.

According to a preferred embodiment of the invention, the delay cell DCELL may be implemented by an inverter or may comprise at least an inverter. FIG. 4 shows another exemplary circuit diagram of a digitally controlled oscillator according to another embodiment of the invention. The digitally controlled oscillator 410 is also a two-stage oscillator, and the delay cell is implemented by an inverter.

Figure 5A:
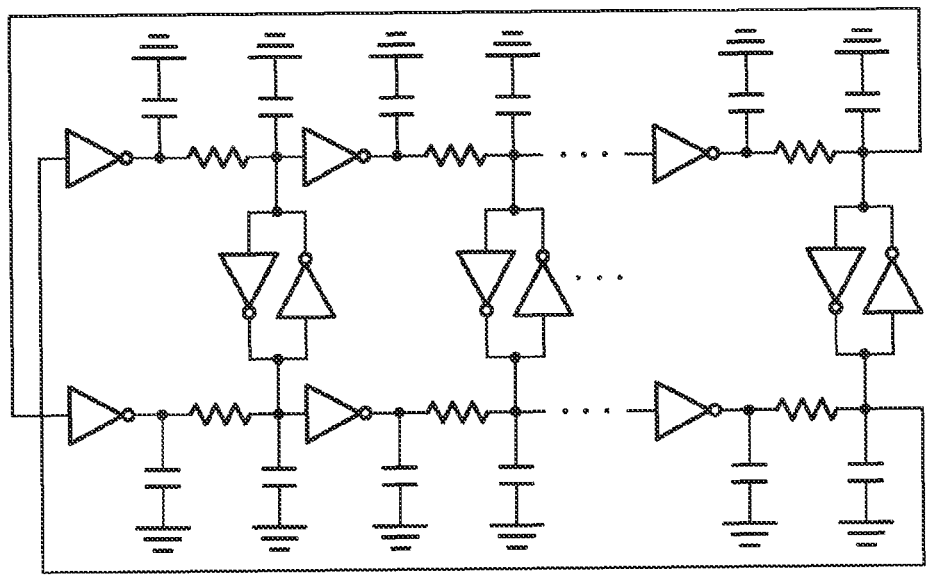
FIG. 5a shows yet another exemplary circuit diagram of a digitally controlled oscillator according to another embodiment of the invention.

FIG. 5a shows yet another exemplary circuit diagram of a digitally controlled oscillator according to yet another embodiment of the invention. As shown in FIG. 5a, the digitally controlled oscillator 510A is an N-stage oscillator, where N is an even number. Each latch of the first supplementary circuit is coupled to the input nodes of the two inverters (or delay cells).

Figure 5B:
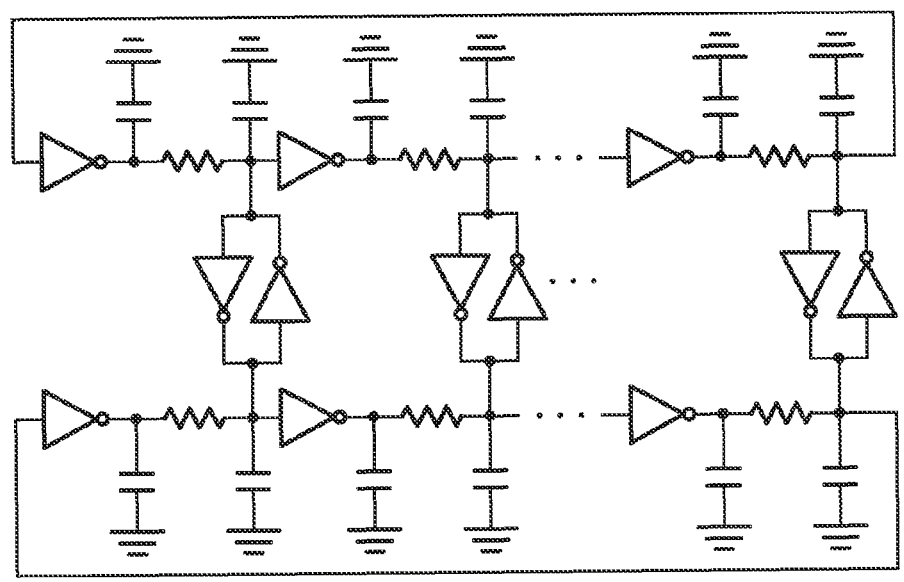
FIG. 5b shows yet another exemplary circuit diagram of a digitally controlled oscillator according to another embodiment of the invention.

FIG. 5b shows yet another exemplary circuit diagram of a digitally controlled oscillator according to yet another embodiment of the invention. Different from FIG. 5a, in FIG. 5b, the digitally controlled oscillator 510B is an N-stage oscillator, where N is an odd number.

Figure 6A:
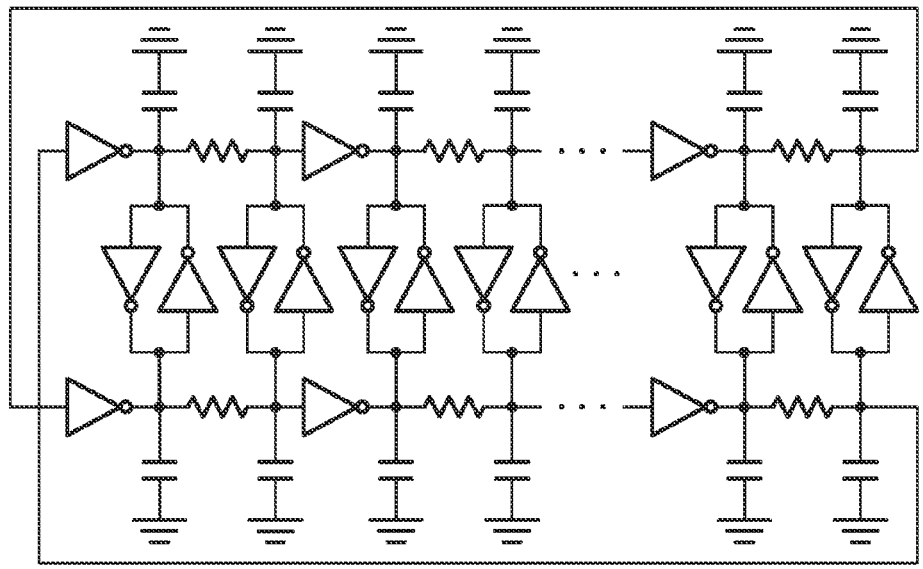
FIG. 6a shows still another exemplary circuit diagram of a digitally controlled oscillator according to yet another embodiment of the invention.

FIG. 6a shows still another exemplary circuit diagram of a digitally controlled oscillator according to still another embodiment of the invention. As shown in FIG. 6a, the digitally controlled oscillator 610A is an N-stage oscillator, where N is an even number. Two latches of the first supplementary circuit are commonly coupled to the input nodes of the two inverters (or delay cells).

Figure 6B:
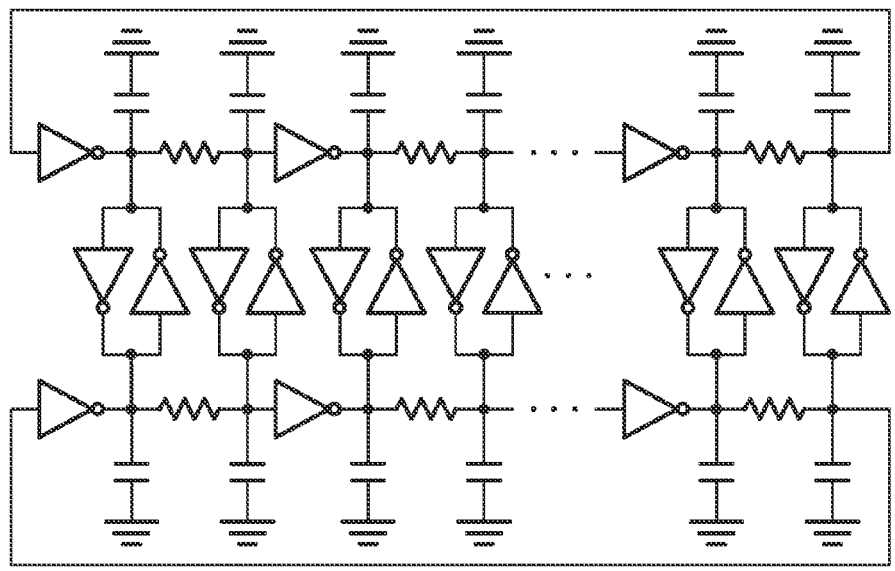
FIG. 6b shows still another exemplary circuit diagram of a digitally controlled oscillator according to yet another embodiment of the invention.

FIG. 6b shows still another exemplary circuit diagram of a digitally controlled oscillator according to still another embodiment of the invention. Different from FIG. 6a, in FIG. 6b, the digitally controlled oscillator 610B is an N-stage oscillator, where N is an odd number.

According to an embodiment of the invention, the supply voltage provided to the digitally controlled oscillator may further be regulated via a variable resistor, such that the digitally controlled oscillator may receive a regulated supply voltage VDD' with further improved PSRR.

Referring back to FIG. 1, in some other embodiments of the invention, the phase locked loop circuit 100 may further comprise a variable resistor R coupled between the supply voltage VDD and the digitally controlled oscillator 40 and a digital calibration circuit 60. The resistance of the variable resistor R is controllable in response to a control signal Ctrl. The digital calibration circuit 60 is coupled to the digital loop filter 30 to receive the digital code Dig_Code and generate the control signal Ctrl according to the digital code Dig_Code.

According to an embodiment of the invention, a calibration phase may begin when the phase locked loop circuit 100 enters a locked phase and the oscillating frequency of the phase locked loop circuit 100 is locked. For example, the oscillating frequency of the feedback signal FB is stable and locks to that of the reference signal REF. During the calibration phase, the digital calibration circuit 60 may generate the control signal Ctrl to repeatedly adjust the resistance of the variable resistor R, so as to calibrate the oscillating frequency generated by the digitally controlled oscillator 40 by regulating the supply voltage VDD via the variable resistor R in the background to generate the regulated supply voltage VDD'. The goal of regulating the supply voltage VDD in the calibration phase is to facilitate the digital loop filter 30 to output a minimum digital code.

Figure 7:
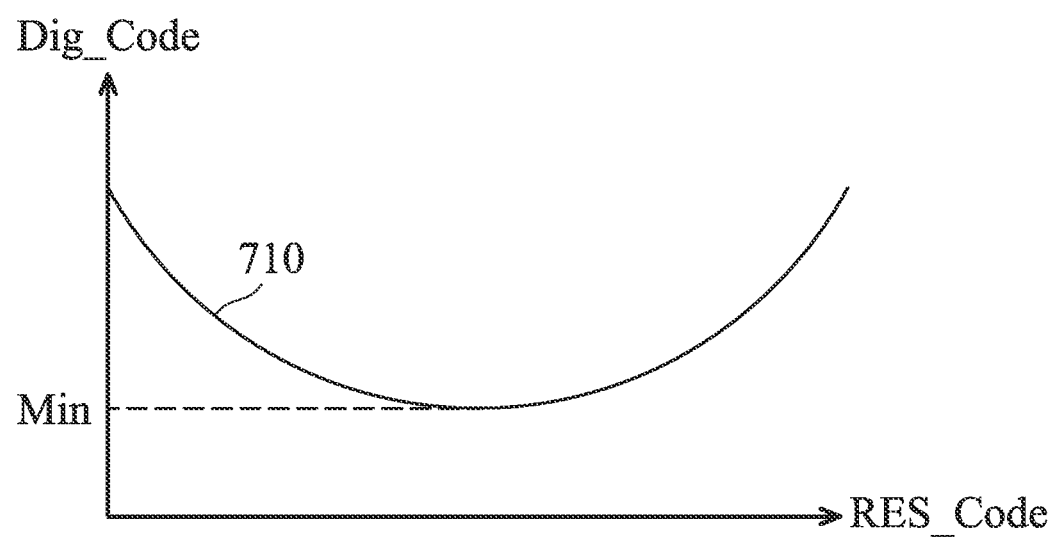
FIG. 7 shows a characteristic curve of resistance versus digital code according to an embodiment of the invention.

FIG. 7 shows a characteristic curve of a resistance versus the digital code according to an embodiment of the invention, where the X axis represents the resistance code RES_Code corresponding to the variable resistor R and the Y axis represents the digital code Dig_Code. According to an embodiment of the invention, the variable resistor R may be implemented by a plurality of resistive devices (for example, resistors, transistors, or others) coupled in parallel. Thus, in the embodiment, as the resistance code RES_Code increases, the overall resistance contributed by the variable resistor R decreases and thus the regulated supply voltage provided to the digitally controlled oscillator increases. Therefore, the characteristic curve 710 shows the relationship of the digital code versus the supply voltage. Note that the variable resistor R may also be implemented by a plurality of resistive devices coupled in serial or parallel, or other methods as well-known in the art, and the invention should not be limited thereto.

As previously discussed, the goal of regulating the supply voltage VDD in the calibration phase is to facilitate the digital loop filter 30 to output a minimum digital code. Therefore, the minimum digital code Min as shown in FIG. 7 is the target to achieve. According to an embodiment of the invention, the digital calibration circuit 60 may initially generate the control signal Ctrl to adjust the resistance of the variable resistor R (that is, the resistance code RES_Code) in an increasing/decreasing manner, determine whether a currently received digital code is greater than a previously received digital code, and generate the control signal Ctrl with a changed value, which indicates a direction for adjusting the resistance, so as to adjust the resistance in a reversed, that is, a decreasing/increasing, manner, when the currently received digital code is greater than the previously received digital code. On the other hand, the digital calibration circuit 60 may continue to generate the control signal with an unchanged value, which indicates an unchanged direction for adjusting the resistance, so as to adjust the resistance in the increasing/decreasing manner when the currently received digital code is not greater than the previously received digital code.

After several repeated attempts, the digital loop filter 30 may finally output a minimum digital code. Comparing the curve 710 in FIG. 7 and the curve 320 in FIG. 3, the curve 710 is complementary to the curve 320 and the minimum digital code Min corresponds to the optimal point. Therefore, when the minimum digital code is achieved, the PSRR approaches infinity and the sensitivity of the oscillation frequency to the supply voltage drift becomes zero. The oscillation frequency is therefore very stable.

Figure 8:
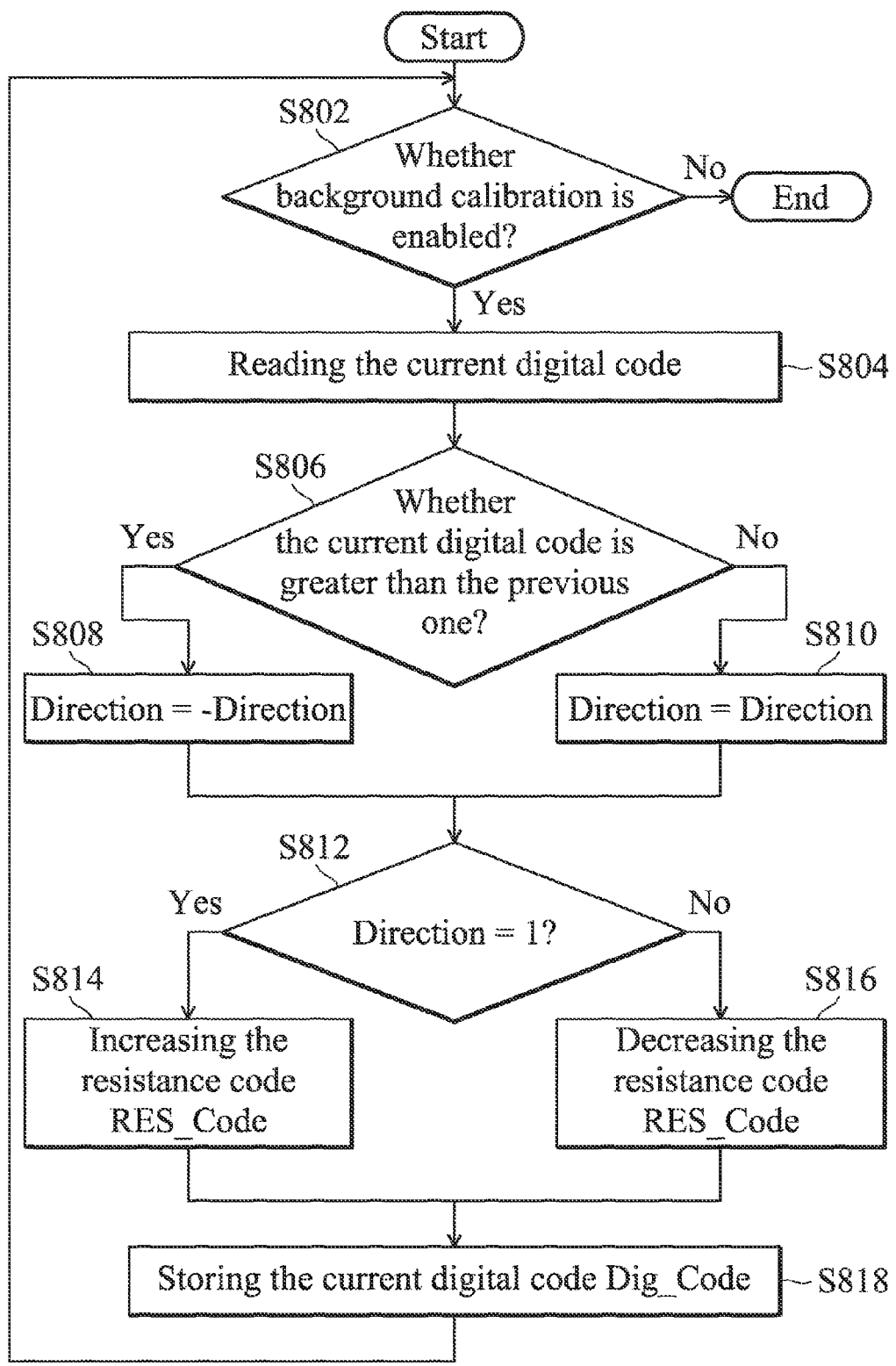
FIG. 8 is a flow chart of a calibration method according to an embodiment of the invention.

FIG. 8 is a flow chart of a calibration method according to an embodiment of the invention. The digital calibration circuit 60 may first determine whether background calibration is enabled (Step S802). The background calibration may be enabled when, for example, the phase locked loop circuit enters the locked phase. When the background calibration is enabled, the digital calibration circuit 60 may then read the current digital code Dig_Code (Step S804). The digital calibration circuit 60 may further determine whether the current digital code is greater than the previous one (Step S806). As previously discussed, the digital calibration circuit 60 may initially adjust the resistance of the variable resistor R in a predetermined direction. If the current digital code is greater than the previous one, the digital calibration circuit 60 may set the variable Direction=−Direction (Step S808). The variable Direction may be changed between 1 or −1. If not, the digital calibration circuit 60 may keep the direction unchanged and set the variable Direction=Direction (Step S810). Next, the digital calibration circuit 60 may further determine whether the variable Direction equals to 1 (Step S812). If so, the digital calibration circuit 60 may generate the control signal to increase the resistance code RES_Code (Step S814). As discussed above, in the embodiment, as the resistance code RES_Code increases, the overall resistance contributed by the variable resistor R decreases and thus the regulated supply voltage provided to the digitally controlled oscillator increases. If not, the digital calibration circuit 60 may generate the control signal to decrease the resistance code RES_Code (Step S816). Finally, the digital calibration circuit 60 may store the current digital code Dig_Code (Step S818) as the previous one used in the next calibration operation, and then step S802 is performed.

As previously discussed, after several repeated attempts, the digital loop filter 30 may finally output a minimum digital code. When the minimum digital code is achieved, the PSRR approaches infinity and the sensitivity of the oscillation frequency to the supply voltage drift becomes zero. The oscillation frequency is therefore very stable.

While the invention has been described by way of example and in terms of preferred embodiment, it is to be understood that the invention is not limited thereto. Those who are skilled in this technology can still make various alterations and modifications without departing from the scope and spirit of this invention. Therefore, the scope of the present invention shall be defined and protected by the following claims and their equivalents.

What is claimed is:

1. A digitally controlled oscillator, comprising:
   a ring oscillator comprising a plurality of stages of delay cells coupled in a circuitous manner, the ring oscillator coupled to a supply voltage and generating a signal oscillated at an oscillating frequency, wherein the oscillating frequency is controlled by a digital code and further varies with a supply voltage drift in a first direction; and
   a plurality of supplementary circuits, each supplementary circuit comprising a plurality of latches, the supplementary circuit interconnected between successive delay cells and comprising a resistor directly connected between two grounded capacitors, wherein one of the plurality of latches is directly connected to one node of the resistor and another one of the plurality of latches is directly connected to another node of the resistor, said each supplementary circuit facilitating the oscillating frequency to vary with the supply voltage drift in a second direction opposite to the first direction.

2. The digitally controlled oscillator as claimed in claim 1, wherein the plurality of supplementary circuits facilitate the oscillating frequency to decrease as the supply voltage increases.

3. A phase locked loop circuit, comprising:
   a phase frequency detector, detecting a phase difference between a feedback signal and a reference signal, and generating a phase error signal in response to the detected phase difference;
   a digital loop filter, outputting a digital code based on the phase error signal;
   a digitally controlled oscillator, coupled to a supply voltage, receiving the digital code and generating a signal oscillated at an oscillating frequency in response to the digital code; and
   a divider, receiving the signal generated by the digitally controlled oscillator to generate the feedback signal,
   wherein the digitally controlled oscillator comprises:
   a ring oscillator comprising a plurality of stages of delay cells coupled in a circuitous manner; and
   a plurality of supplementary circuits, each supplementary circuit comprising a plurality of latches, the supplementary circuit interconnected between successive delay cells and comprising a resistor directly connected between two grounded capacitors, wherein one of the plurality of latches is directly connected to one node of the resistor and another one of the plurality of latches is directly connected to another node of the resistor, said each supplementary circuit facilitating the oscillating frequency to decrease as the supply voltage increases.

4. A phase locked loop circuit, comprising:

a phase frequency detector, detecting a phase difference between a feedback signal and a reference signal, and generating a phase error signal in response to the detected phase difference;

a digital loop filter, outputting a digital code based on the phase error signal;

a digitally controlled oscillator, coupled to a supply voltage, receiving the digital code and generating a signal oscillated at an oscillating frequency in response to the digital code; and a divider, receiving the signal generated by the digitally controlled oscillator to generate the feedback signal, a variable resistor, coupled between the supply voltage and the digitally controlled oscillator and providing a resistance controllable in response to a control signal; and a digital calibration circuit, coupled to the digital loop filter, receiving the digital code and generating the control signal according to the digital code, and wherein the digitally controlled oscillator comprises:

a ring oscillator;

a first supplementary circuit, coupled to the ring oscillator for facilitating the oscillating frequency to decrease as the supply voltage increases, wherein the ring oscillator comprises a plurality of stages of delay cells coupled in a cyclic manner, and the first supplementary circuit comprises a plurality of latches, and wherein two latches of the first supplementary circuit are commonly coupled to input nodes of two delay cells of the plurality of stages of delay cells, wherein the supply voltage is regulated via the variable resistor before being received by the digitally controlled oscillator.

5. The phase locked loop circuit as claimed in claim 4, wherein the digital calibration circuit generates the control signal to repeatedly adjust the resistance such that a minimum digital code is outputted by the digital loop filter.

6. The phase locked loop circuit as claimed in claim 4, wherein the digital calibration circuit initially generates the control signal to adjust the resistance in a increasing/decreasing manner, determines whether a currently received digital code is greater than a previously received digital code, and generates the control signal to adjust the resistance in a decreasing/increasing manner when the currently received digital code is greater than the previously received digital code.

7. The phase locked loop circuit as claimed in claim 6, wherein the digital calibration circuit continues to generate the control signal to adjust the resistance in the increasing/decreasing manner when the currently received digital code is not greater than the previously received digital code.

* * * * *